United States Patent
Stolitzka et al.

(10) Patent No.: US 10,447,429 B2
(45) Date of Patent: Oct. 15, 2019

(54) METHODS TO TRANSPORT FORWARD ERROR CORRECTION CODES IN A SYMBOL ENCODED TRANSMISSION STREAM

(71) Applicant: SAMSUNG DISPLAY CO., LTD., Yongin, Gyeonggi-Do (KR)

(72) Inventors: Dale F. Stolitzka, Los Altos, CA (US); Jalil Kamali, San Jose, CA (US)

(73) Assignee: Samsung Display Co., Ltd., Yongin-si (KR)

(*) Notice: Subject to any disclaimer, the term of this patent is extended or adjusted under 35 U.S.C. 154(b) by 28 days.

(21) Appl. No.: 14/723,075

(22) Filed: May 27, 2015

(65) Prior Publication Data
US 2015/0349920 A1 Dec. 3, 2015

Related U.S. Application Data

(60) Provisional application No. 62/004,137, filed on May 28, 2014.

(51) Int. Cl.
*H04L 1/00* (2006.01)
*H04L 25/49* (2006.01)
(Continued)

(52) U.S. Cl.
CPC ...... *H04L 1/0041* (2013.01); *H03M 13/1515* (2013.01); *H03M 13/19* (2013.01);
(Continued)

(58) Field of Classification Search
CPC ... H04L 1/0057; H04L 1/0061; H04L 1/0072; H04L 1/0041; H04L 1/0043;
(Continued)

(56) References Cited

U.S. PATENT DOCUMENTS 6,182,264 B1 1/2001 Ott
6,505,320 B1 1/2003 Turk et al.
(Continued)

FOREIGN PATENT DOCUMENTS

CN 101714971 A 5/2010
CN 101729194 A 6/2010
(Continued)

OTHER PUBLICATIONS

EPO Search Report dated May 9, 2016, for corresponding European Patent application 15198105.7, (11 pages).
(Continued)

*Primary Examiner* — April Y Blair
*Assistant Examiner* — Sazzad Hossain
(74) *Attorney, Agent, or Firm* — Lewis Roca Rothgerber Christie LLP

(57) ABSTRACT

A method to transport forward error correction (FEC) codes in a symbol encoded transmission stream includes encoding a data stream from a data source into data symbols using computing circuits, generating first FEC codes from the data symbols using the computing circuits, encoding the first FEC codes into first FEC symbols using the computing circuits, merging the data symbols and the first FEC symbols into the transmission stream using the computing circuits, and transmitting the merged transmission stream to a sink device using the computing circuits. The encoding of the data stream into the data symbols and the encoding of the first FEC codes into the first FEC symbols may include the same encoding technique.

22 Claims, 7 Drawing Sheets

(51) Int. Cl.
    *H03M 13/15* (2006.01)
    *H03M 13/19* (2006.01)
    *H03M 13/29* (2006.01)
    *H03M 13/31* (2006.01)
    *G06F 3/06* (2006.01)
    *H03M 13/03* (2006.01)

(52) U.S. Cl.
    CPC ....... H03M 13/2906 (2013.01); H03M 13/31 (2013.01); H04L 1/0043 (2013.01); H04L 1/0052 (2013.01); H04L 1/0057 (2013.01); H04L 1/0065 (2013.01); H04L 25/49 (2013.01); *G06F 3/0619* (2013.01); *H03M 13/03* (2013.01); *H03M 13/2942* (2013.01); *H04L 1/0061* (2013.01); *H04L 1/0072* (2013.01)

(58) Field of Classification Search
    CPC .. H04L 1/0052; H04L 25/49; H03M 13/2906; H03M 13/03; H03M 13/2942; G06F 3/0619
    See application file for complete search history.

(56) References Cited

U.S. PATENT DOCUMENTS

| | | | |
|---|---|---|---|
| 6,621,982 | B1 | 9/2003 | Kimura et al. |
| 6,662,334 | B1 | 12/2003 | Stenfort |
| 7,555,695 | B2 | 6/2009 | Oogami et al. |
| 8,279,755 | B2 | 10/2012 | Luby |
| 8,332,721 | B2 | 12/2012 | Lawson |
| 2001/0053225 | A1* | 12/2001 | Ohira ................ H04L 1/0083 380/239 |
| 2002/0199153 | A1 | 12/2002 | Fall |
| 2004/0044835 | A1 | 3/2004 | Gongwer et al. |
| 2005/0138522 | A1* | 6/2005 | Silvus ................ H03M 13/31 714/758 |
| 2006/0195752 | A1 | 8/2006 | Walker et al. |
| 2008/0028279 | A1* | 1/2008 | Ver Steeg ............ H04L 1/1829 714/776 |
| 2008/0098282 | A1 | 4/2008 | Chien |
| 2008/0282130 | A1* | 11/2008 | Lee ................ H04L 1/0053 714/758 |
| 2009/0019306 | A1 | 1/2009 | Hum et al. |
| 2009/0193314 | A1* | 7/2009 | Melliar-Smith ............ H03M 13/2921 714/755 |
| 2010/0050057 | A1* | 2/2010 | Luby ................ H04L 1/0041 714/776 |
| 2011/0141898 | A1* | 6/2011 | Nishioka ................ H04L 12/42 370/236 |
| 2012/0117442 | A1* | 5/2012 | Lee ................ H04L 1/008 714/755 |
| 2013/0308540 | A1* | 11/2013 | Abe ................ H04L 1/0067 370/328 |
| 2014/0344650 | A1* | 11/2014 | Au ................ G06F 11/10 714/776 |

FOREIGN PATENT DOCUMENTS

| | | |
|---|---|---|
| CN | 103152126 A | 6/2013 |
| KR | 10-2004-0004672 A | 1/2004 |
| KR | 10-2009-0101240 A | 9/2009 |
| KR | 10-2012-004662 A | 1/2012 |
| TW | 586273 B | 5/2004 |
| WO | WO 01/67447 A2 | 9/2001 |

OTHER PUBLICATIONS

KR Patent Registration No. 10-0903513 dated Jun. 11, 2009.
KR Patent Registration No. 10-1341933 dated Dec. 10, 2013.
U.S. Office Action dated Jun. 15, 2017, issued in cross-reference U.S. Appl. No. 14/952,797 (21 pages).
U.S. Advisory Action dated Apr. 5, 2018, issued in U.S. Appl. No. 14/952,797 (8 pages).
U.S. Final Office Action dated Dec. 19, 2017, issued in cross-reference U.S. Appl. No. 14/952,797 (26 pages).
U.S. Office Action dated Jan. 2, 2019, issued in U.S. Appl. No. 14/952,797 (16 pages).

\* cited by examiner

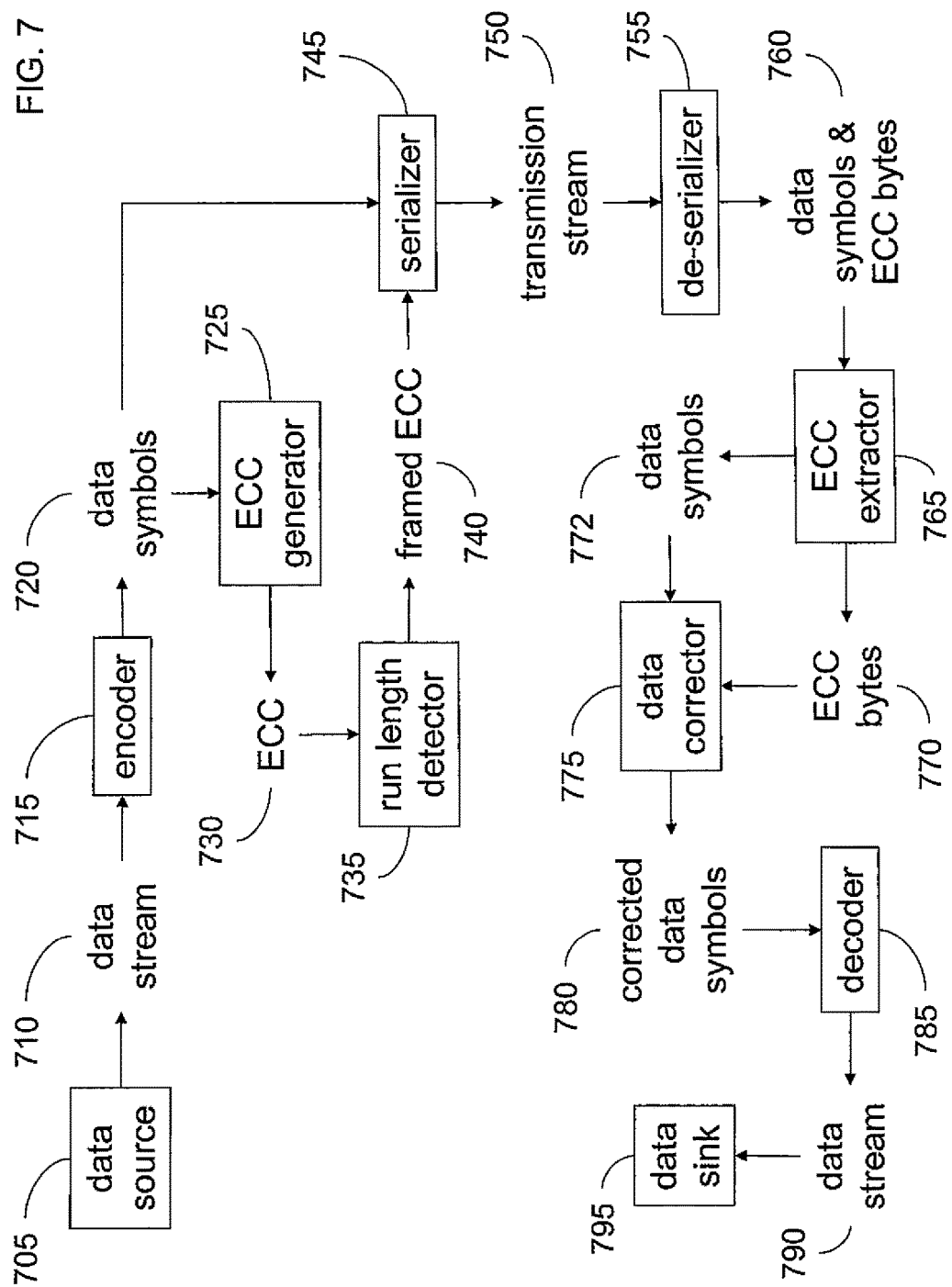

METHODS TO TRANSPORT FORWARD ERROR CORRECTION CODES IN A SYMBOL ENCODED TRANSMISSION STREAM

CROSS-REFERENCE TO RELATED APPLICATION(S)

This application claims priority to and the benefit of U.S. Provisional Application No. 62/004,137, filed on May 28, 2014, the entire content of which is incorporated herein by reference.

BACKGROUND

1. Field

Aspects of embodiments of the present invention relate to methods to transport forward error correction (FEC) codes in a symbol encoded transmission stream.

2. Description of Related Art

High-speed data transmission may be implemented using a serial data link (e.g., one bit at a time, such as with a fiber optic cable link). A data stream may be composed of a number of bytes (e.g., 8-bit bytes). DC balancing, such as with an 8 b/10 b encoding, may be used to encode the data stream ("data bytes") before transmitting (for example, 8-bit bytes may be converted to 10-bit symbols) so that the number of 0-bits being transmitted equals (or substantially equals, such as being no more than one or two off from) the number of l-bits being transmitted, and with no single burst of either 0-bits or 1-bits (e.g., no more than five consecutive 0-bits or 1-bits). The encoded data stream is then decoded on the receiving side, such as with a corresponding 10 b/8 b decoding, to recover the original data stream. These techniques may help, for example, with DC balancing, clock recovery, and phase recovery, such as helping receiving devices determine the transmission rate of the transmitted encoded data.

Forward error correction (FEC) codes, such as Hamming codes, Reed-Solomon codes, or low-density parity-check (LDPC) codes, may be used in data transmissions to improve reliability of the communication by providing redundant bits or bytes ("parity bits" or "parity bytes") for error checking and error correction. These parity bits or bytes accompany the data transmission (data bits or bytes) and allow the receiver to verify the correct data was sent and may even allow the receiver the ability to correct a limited number of errors in the transmission. Hamming codes are relatively straightforward and efficient, but correct only a limited number of errors (e.g., a few bits). Reed-Solomon and LDPC codes are more computationally intensive than Hamming codes, but provide for significantly more errors to be detected or corrected (e.g., entire bytes).

Forward error correction may also be combined with DC balancing. For example, parity bits or bytes may be generated for a data stream (data bytes) for forward error correction, and the data plus parity bits or bytes encoded through DC balancing into symbols before being transmitted. The receiver then decodes the symbols and performs the error detection and correction using the decoded parity bits or bytes on the decoded data bits or bytes. However, this introduces a problem with errors introduced during the data transmission. For example, a corrupted symbol may be mapped to an invalid symbol or to a valid symbol representing a different byte, thus causing something as small as a one-bit error in transmission to result in multiple bit errors (e.g., an entire byte, which may include 8 separate bit errors) in the received data and parity. This may present problems for low-cost FEC algorithms such as Hamming codes, or force the use of a more complex FEC algorithm (such as Reed-Solomon or LDPC) to provide the capability to recover from one or more byte errors, versus only a few bit errors, which increases encoder and decoder complexity.

SUMMARY

Embodiments of the present invention provide for methods to transport FEC codes in a symbol encoded transmission stream Further embodiments provide for a method of placing the FEC algorithm function after encoding the data stream into symbols and before decoding the data stream from symbols. Still further embodiments provide for a method of inserting an ECC (error correction code, also synonymously referred to as FEC code throughout) generated by the FEC algorithm into the main data stream. Even further embodiments of the present invention provide for creating an ECC of an encoded transmission stream, efficiently transporting the ECC's (error correction codes, made up of redundancy bits in the transmission stream), extracting the ECC's, and correcting bit errors in the transmission scheme prior to decoding (hereinafter referred to as "symbol-based error correction").

Additional embodiments are directed to reducing cost and latency of correcting a high-speed transmission stream. By way of example, some embodiments are directed to reducing cost by enabling a simple FEC algorithm (such as a Hamming code with one or two bit error correction or detection) to correct an encoded transmission stream. This may enable more complex FEC algorithms, such as Reed-Solomon or LDPC, to be avoided, which may save an order of magnitude in complexity (e.g., logic gate count) of an equivalent encoding/decoding solution. This may also enable high latency solutions, such as horizontal and vertical parity checking (and its associated large amount of packet buffering), to be avoided.

According to an embodiment of the present invention, a method to transport forward error correction (FEC) codes in a symbol encoded transmission stream is provided. The method includes encoding a data stream from a data source into data symbols using computing circuits, generating first FEC codes from the data symbols using the computing circuits, encoding the first FEC codes into first FEC symbols using the computing circuits, merging the data symbols and the first FEC symbols into the transmission stream using the computing circuits, and transmitting the merged transmission stream to a sink device using the computing circuits.

The encoding of the data stream into the data symbols and the encoding of the first FEC codes into the first FEC symbols may include the same encoding technique.

The method may further include generating second FEC codes from the first FEC codes using the computing circuits, and encoding the second FEC codes into second FEC symbols using the computing circuits. The merging of the data symbols and the first FEC symbols may include merging the second FEC symbols into the transmission stream using the computing circuits.

The merging of the data symbols and the first FEC symbols may include merging a control symbol between the data symbols and the first FEC symbols into the transmission stream using the computing circuits.

The merging of the data symbols and the first FEC symbols may include merging the first FEC symbols after the data symbols into the transmission stream using the computing circuits.

The transmitting of the merged transmission stream may include serializing the merged transmission stream using the computing circuits, and transmitting the serialized transmission stream over a serial data link to the sink device using the computing circuits.

The merging of the data symbols and the first FEC symbols may further include merging a control symbol after the first FEC symbols into the transmission stream using the computing circuits.

The sink device may include a display device.

According to another embodiment of the present invention, a method to transport forward error correction (FEC) codes in a symbol encoded transmission stream is provided. The method includes receiving the transmission stream from a source device using computing circuits, separating the received transmission stream into data symbols and first FEC symbols using the computing circuits, decoding the first FEC symbols into first FEC codes using the computing circuits, correcting errors in the data symbols with the first FEC codes using the computing circuits, and decoding the corrected data symbols into a data stream using the computing circuits.

The decoding of the first FEC symbols into the first FEC codes and the decoding of the corrected data symbols into the data stream may include the same decoding technique.

The separating of the received transmission stream may include separating the received transmission stream into second FEC symbols using the computing circuits. The method may further include decoding the second FEC symbols into second FEC codes using the computing circuits, and correcting errors in the first FEC codes with the second FEC codes using the computing circuits. The correcting of the errors in the data symbols may include correcting the errors in the data symbols with the corrected first FEC codes using the computing circuits.

The separating of the received transmission stream may include separating a control symbol between the data symbols and the first FEC symbols from the transmission stream using the computing circuits.

The separating of the received transmission stream may include separating the data symbols from the received transmission stream before separating the first FEC symbols using the computing circuits.

The receiving of the transmission stream may include: receiving the transmission stream from the source device over a serial data link using the computing circuits, and de-serializing the received transmission stream using the computing circuits.

The separating of the received transmission stream may further include separating a control symbol after the first FEC symbols from the received transmission stream using the computing circuits.

According to yet another embodiment of the present invention, a method to transport forward error correction (FEC) codes in a symbol encoded transmission stream is provided. The method includes encoding a data stream at a source device from a data source into data symbols using first computing circuits, generating first FEC codes at the source device from the data symbols using the first computing circuits, encoding the first FEC codes at the source device into first FEC symbols using the first computing circuits, merging the data symbols and the first FEC symbols at the source device into the transmission stream using the first computing circuits, transmitting the merged transmission stream from the source device to a sink device using the first computing circuits, receiving the transmitted transmission stream at the sink device from the source device using second computing circuits, separating the received transmission stream at the sink device into received said data symbols and received said first FEC symbols using the second computing circuits, decoding the received first FEC symbols at the sink device into decoded said first FEC codes using the second computing circuits, correcting errors in the received data symbols at the sink device with the decoded first FEC codes using the second computing circuits, and decoding the corrected data symbols at the sink device into a data stream using the second computing circuits.

The encoding of the data stream into the data symbols and the encoding of the first FEC codes into the first FEC symbols may include the same encoding technique. The decoding of the received first FEC symbols into the decoded first FEC codes and the decoding of the corrected data symbols into the data stream may include the same decoding technique.

The method may further include generating second FEC codes at the source device from the first FEC codes using the first computing circuits, and encoding the second FEC codes at the source device into second FEC symbols using the computing circuits. The merging of the data symbols and the first FEC symbols may include merging the second FEC symbols at the source device into the transmission stream using the first computing circuits. The separating of the received transmission stream may include separating the received transmission stream at the sink device into received said second FEC symbols using the second computing circuits. The method may further include decoding the received second FEC symbols at the sink device into decoded said second FEC codes using the second computing circuits, and correcting errors in the decoded first FEC codes at the sink device with the decoded second FEC codes using the second computing circuits. The correcting of the errors in the received data symbols may include correcting the errors in the received data symbols at the sink device with the corrected first FEC codes using the second computing circuits.

The merging of the data symbols and the first FEC symbols may include merging a control symbol at the source device between the data symbols and the first FEC symbols into the transmission stream using the first computing circuits. The separating of the received transmission stream may include separating received said control symbol at the sink device between the received data symbols and the received first FEC symbols from the transmission stream using the second computing circuits.

The merging of the data symbols and the first FEC symbols may include merging the first FEC symbols at the source device after the data symbols into the transmission stream using the first computing circuits. The separating of the received transmission stream may include separating the received data symbols at the sink device from the received transmission stream before separating the received first FEC symbols using the second computing circuits.

The transmitting of the merged transmission stream may include serializing the merged transmission stream at the source device using the first computing circuits, transmitting the serialized transmission stream over a serial data link from the source device to the sink device using the first computing circuits, receiving the transmitted transmission stream at the sink device from the source device over the serial data link using the second computing circuits, and de-serializing the received transmission stream at the sink device using the second computing circuits.

The merging of the data symbols and the first FEC symbols may further include merging a control symbol at the source device after the first FEC symbols into the transmission stream using the first computing circuits. The separating of the received transmission stream may further include separating received said control symbol at the sink device after the first FEC symbols from the received transmission stream using the second computing circuits.

The sink device may include a display device.

According to still yet another embodiment of the present invention, a method to transport forward error correction (FEC) codes in a symbol encoded transmission stream is provided. The method includes encoding a data stream at a source device from a data source into data symbols using first computing circuits, generating FEC codes at the source device from the data symbols using the first computing circuits, buffering the FEC codes at the source device using the first computing circuits until the first computing circuits decide that a first criteria has been met, merging the data symbols and the buffered FEC codes at the source device into the transmission stream using the first computing circuits, transmitting the merged transmission stream from the source device to a sink device using the first computing circuits, receiving the transmitted transmission stream at the sink device from the source device using second computing circuits, separating the received transmission stream at the sink device into received said data symbols and received said buffered FEC codes using the second computing circuits, correcting errors in the received data symbols at the sink device with the received buffered FEC codes using the second computing circuits, and decoding the corrected data symbols at the sink device into a data stream using the second computing circuits.

The merging of the data symbols and the buffered FEC codes may include framing the buffered FEC codes with control symbols, and merging the data symbols and the framed FEC codes at the source device into the transmission stream using the first computing circuits.

The merging of the data symbols and the buffered FEC codes may include merging a control symbol at the source device between the data symbols and the buffered FEC codes in the transmission stream using the first computing circuits. The separating of the received transmission stream may include separating received said control symbol at the sink device between the received data symbols and the received buffered FEC codes from the transmission stream using the second computing circuits.

The merging of the data symbols and the buffered FEC codes may include merging the buffered FEC codes at the source device after the data symbols into the transmission stream using the first computing circuits. The separating of the received transmission stream may include separating the received data symbols at the sink device from the received transmission stream before separating the received buffered FEC codes using the second computing circuits.

The transmitting of the merged transmission stream may include serializing the merged transmission stream at the source device using the first computing circuits, transmitting the serialized transmission stream over a serial data link from the source device to the sink device using the first computing circuits, receiving the transmitted transmission stream at the sink device from the source device over the serial data link using the second computing circuits, and de-serializing the received transmission stream at the sink device using the second computing circuits.

The merging of the data symbols and the buffered FEC codes may further include merging a control symbol at the source device after the buffered FEC codes into the transmission stream using the first computing circuits. The separating of the received transmission stream may further include separating received said control symbol at the sink device after the buffered FEC codes from the received transmission stream using the second computing circuits.

The sink device may include a display device.

In embodiments of the present invention, low-cost FEC algorithms may be used in place of larger (e.g., more area to implement in hardware, more memory to implement in firmware, or more code to implement in software) and more complicated algorithms such as Reed-Solomon and LDPC. For example, embodiments of the present invention may be directed toward DisplayPort display devices configured to receive video transmissions in formats disclosed in the present application.

Embodiments of the present invention provide for methods of transporting FEC codes in a symbol encoded transmission stream that enable a greatly reduced (e.g., reduced cost, reduced complexity, reduced size) data transmission sink device (receiver), a reduced source device (transmitter), and a data stream recoverable with reduced or minimal latency.

BRIEF DESCRIPTION OF THE DRAWINGS

The accompanying drawings, together with the specification, illustrate example embodiments of the present invention. These drawings, together with the description, serve to better explain aspects and principles of the present invention.

FIG. 7 is a block diagram of a transmission stream encoder and decoder according to another embodiment of the present invention.

DETAILED DESCRIPTION

Figure 1:
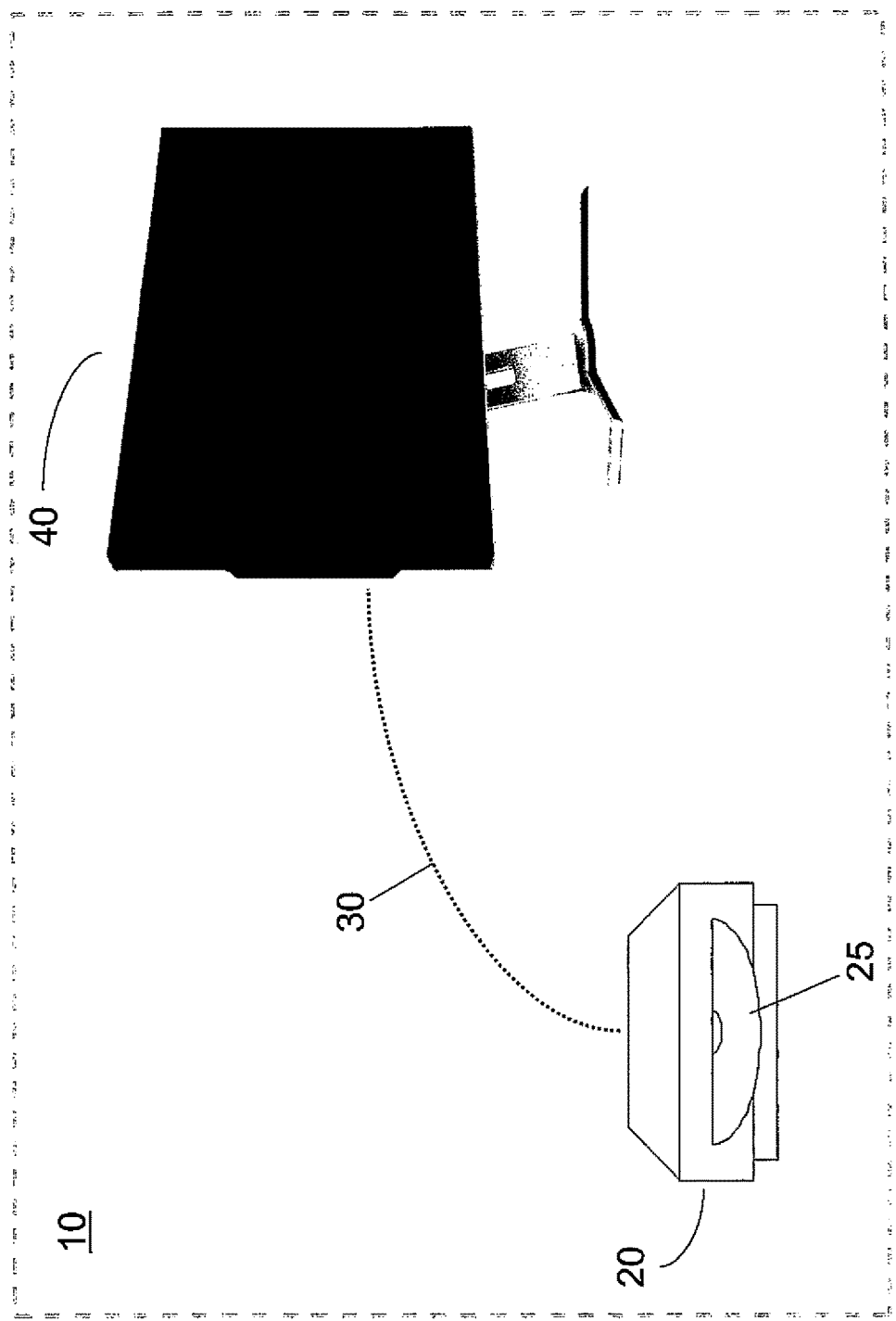
FIG. 1 is a schematic diagram illustrating a system for transporting FEC codes in a symbol encoded transmission stream according to an embodiment of the present invention.

Example embodiments of the present invention will now be described with reference to the accompanying drawings. In the drawings, the same or similar reference numerals refer to the same or similar elements throughout. Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed. Hereinafter, embodiments of the present invention will be described with reference to the accompanying drawings.

The encoders, decoders, and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the encoders and decoders may be formed on one integrated circuit (IC) chip or on separate IC chips. Further, the various components of the encoders or decoders may be implemented on a flexible printed circuit film, a tape carrier package (TCP), a printed circuit board (PCB), or formed on a same substrate as the encoders or decoders.

Further, the various components of the encoders and decoders may be a process or thread, running on one or more processors, in one or more computing devices, executing computer program instructions and interacting with other system components for performing the various functionalities described herein. The computer program instructions are stored in a memory, which may be implemented, in a computing device using a standard memory device, such as, for example, a random access memory (RAM). The computer program instructions may also be stored in other non-transitory computer readable media such as, for example, a CD-ROM, flash drive, or the like. In addition, a person of skill in the art should recognize that the functionality of various computing devices may be combined or integrated into a single computing device, or the functionality of a particular computing device may be distributed across one or more other computing devices without departing from the scope of the present invention.

Aspects of the present invention may be applied to any encoded stream, such as from a source to a display (e.g., using a DisplayPort interface), between two connected devices (e.g., one with a source and one with a sink), etc.

FIG. 1 is a schematic diagram illustrating a system 10 for transporting FEC codes in a symbol encoded transmission stream according to an embodiment of the present invention.

The system 10 includes a source device 20 (such as a CD drive) including or connected to a data source (such as CD, DVD, Blu-ray, or other data source 25), a sink device 40 (e.g., a display device or other device having a data sink, which may include circuitry for driving a display panel), and a communications link 30 (such as a high speed serial data link) for transmitting data between the source device 20 and the sink device 40. The source device 20 and the sink device 40 may each contain computing circuits (e.g., a microprocessor and memory, hardwired circuits, programmable logic arrays, etc.) for performing the methods described herein as well as those derivable from the present application to one of ordinary skill.

Figure 2:
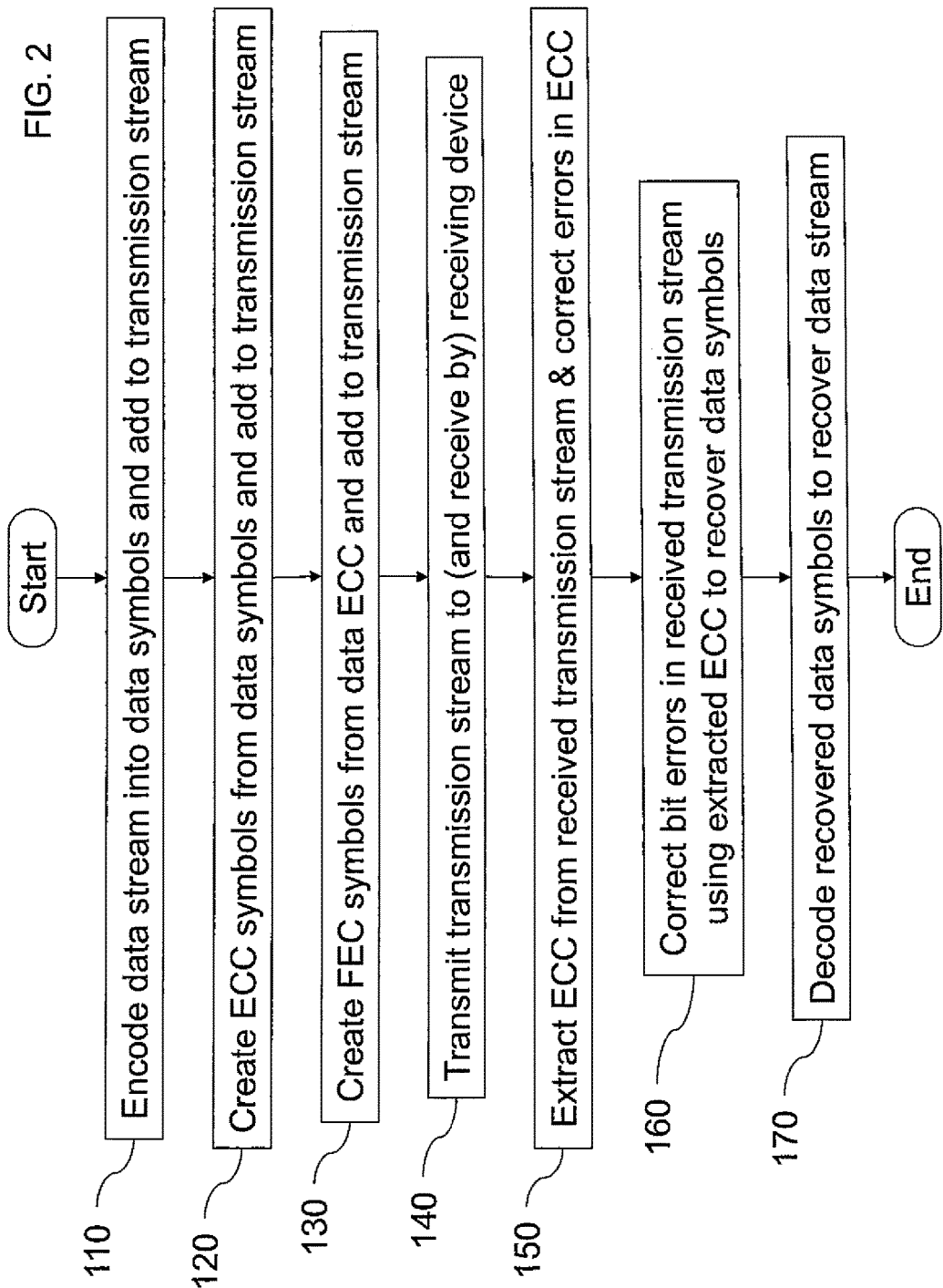
FIG. 2 is a flow chart of a method of transporting FEC codes in a symbol encoded transmission stream according to an embodiment of the present invention.

FIG. 2 is a flow chart of a method of transporting FEC codes in a symbol encoded transmission stream according to an embodiment of the present invention. This and other methods disclosed herein may be implemented, for example, as a series of computer instructions to be executed by a processor (or other computing device), such as a microprocessor, or two or more processors. The processor(s) may execute computer program instructions and interact with other system components for performing the various functionalities described herein. The computer program instructions may be stored in a memory implemented using a standard memory device, such as, for example, a random access memory (RAM). The computer program instructions may also be stored in other non-transitory computer readable media such as, for example, a CD-ROM, flash drive, or the like. The methods may also be implemented using hardware circuits (e.g., transistors, capacitors, logic gates, FPGAs, etc.), or combinations of hardware circuits, software, and firmware, as would be apparent to one of ordinary skill.

Figure 3:
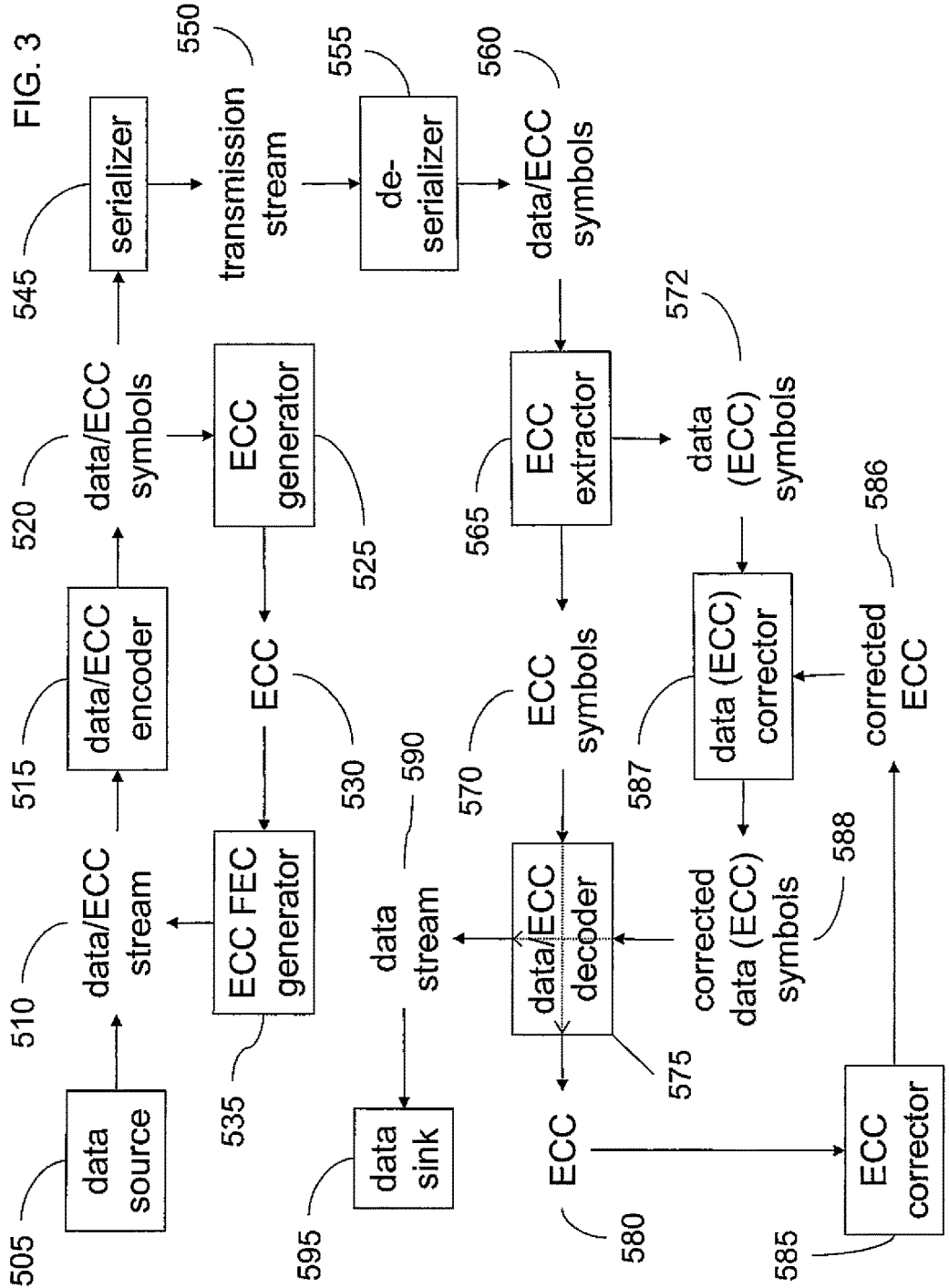
FIG. 3 is a block diagram of a transmission stream encoder and decoder according to an embodiment of the present invention.

FIG. 3 is a block diagram of a transmission stream encoder and decoder according to an embodiment of the present invention, such as the embodiment of FIG. 2. This and other logic circuits disclosed herein, such as those of FIG. 7, may be implemented, for example, as a layout of hardware circuits (e.g., AND/OR gates, multiplexers, amplifiers, etc.), field programmable gate arrays, firmware, or software executed by an appropriate processing circuit, such as a microprocessor, or any suitable combination of hardware, software (e.g., computer instructions stored in memory and executed on a computer or microprocessor), and firmware as would be known to those skilled in the art.

Referring to FIG. 2 and FIG. 3, processing begins, and in step 110, a data stream 510 supplied by a data source 505 is encoded into symbols (or data symbols) 520 by a data encoder 515 and added to a transmission stream 550 (for example, a serial transmission stream 550 by a serializer 545). The data stream 510 may include, for example, 8-bit bytes of data to be transmitted from the data source, such as a video source device, to a receiving (or sink) device, such as a display device. The data bytes may represent image data to be displayed on a display panel of the display device. This data symbol encoding may be performed on sets (or packets) of data bytes (e.g., 8 or 64 bytes in each packet) at a time from the data stream 510, each packet of data bytes from the data stream 510 being encoded into a corresponding packet of data symbols 520 that is added to the transmission stream 550.

The data symbols 520 may be 10-bit symbols, with each byte of the data stream 510 being represented by one of the data symbols 520. For example, a standard 8/10 encoder (8-bit bytes as input, 10-bit symbols as output), as would be known by one of ordinary skill, may be used to implement this step. Such encoding is useful, for example, for creating DC-balanced streams (e.g., same number of 0-bits as 1-bits), for performing clock recovery or phase recovery, and for guaranteeing sufficient or sufficiently dense transitions (e.g., 0-bit to 1-bit transitions or vice versa) in a serial bit stream.

These data byte/symbol sizes, packet sizes, and encoding/decoding techniques, however, are but examples, and the present invention is not limited thereto. For ease of description, though, an 8-bit data byte, 10-bit symbol, and standard 8/10 encoding and 10/8 decoding will be assumed throughout, with different data byte/symbol sizes and their corresponding encoding/decoding algorithms being part of similar embodiments of the present invention as would be apparent to one of ordinary skill. In addition to the data stream 510, there may be other input data, including auxiliary data (e.g., audio) and metadata that undergo encoding prior to transmitting. For further ease of description, auxiliary data will not be treated any differently than regular input data, and it will be assumed that the only metadata is the error correcting code bits, bytes, and symbols that will now be described.

In step 120, the data symbols 520, in addition to being fed into the (serial) transmission stream 550 (via the serializer 545), are used to create a first error correcting code (ECC) 530 for the data symbols 520 by a first ECC generator 525, where the first ECC 530 includes a set of redundancy (or parity) bits or bytes. In step 130, the first ECC 530 may be assembled into groups of bytes and inserted into the data stream 510 and then encoded into symbols (e.g., parity symbols or ECC symbols) 520 to accompany the data symbols 520 in the transmission stream 550 using the same encoding scheme as the data bytes. For example, a Hamming code (as is known to one of ordinary skill) may be used to generate the redundancy (parity) bits (first ECC) 530 for the data symbols 520, and these parity bits or bytes 530 may then be encoded into parity (ECC) symbols 520. For ease of description, ECC (such as the first ECC 530) will be described as bytes, and the corresponding ECC symbols (such as the ECC symbols 520) will be symbols, such as the same example 8-bit bytes and 10-bit symbols used for the data bytes and data symbols.

This first ECC processing may be performed on each packet of data symbols 520, creating a corresponding group of first ECC bytes 530 in the process. The groups of first ECC bytes 530 may be buffered until a sufficient number of data packets (e.g., a number of data packets that improves efficiency of the ECC creation) have been encoded and added to the transmission stream 550. The groups of first ECC bytes 530 may then be added to the data stream 510, encoded into corresponding groups of ECC symbols 520, and added to the transmission stream 550 via the serializer 545. The Hamming code may have sufficient parity bits, for example, to detect multiple bit errors or to correct a single bit error in a set (e.g., a group or packet) of symbols in the transmission stream 550, or to detect multiple bit errors and to correct a single bit error in the set of symbols, or to correct multiple bit errors in the symbols.

Since the first ECC bytes 530 enter the data stream and undergo the same encoding, serializing, etc., many of the components in FIG. 3 are labeled "data/ECC" to point out this dual role (e.g., data/ECC encoder 515). For ease of description, the components and their corresponding references numerals of FIG. 3 may also be described as "data" or "ECC" depending on the context (e.g., data symbols 520 or ECC symbols 520).

In some embodiments, the ECC symbols 520 may be passed to the serializer 545 without further processing (e.g., without sending the ECC symbols 520 through the first ECC generator 525). In other embodiments, the ECC symbols 520, in addition to being inserted into the transmission stream 550 (via the serializer 545) like the data symbols 520, may also be further treated like data and processed by the first ECC generator 525 a second time to generate (higher level) first ECC 530 (that is, higher level ECC of the ECC symbols), which in turn may be assembled into bytes and inserted into the data/ECC stream 510 and encoded into symbols 520 by the data/ECC encoder 515. This protects simple transmission errors in the ECC symbols from compounding into multiple errors (e.g., protects bit errors from turning into byte errors). Computationally, this is similar to treating the first ECC symbols 520 (that is, metadata) as data for another pass through the first ECC generator 525. This process may further be extended to still higher levels (more passes through the first ECC generator 525), as would be apparent to one of ordinary skill. For ease of description, only one such pass will be described with reference to FIG. 2 and FIG. 3, with details for multiple passes added in places for clarification.

In further detail, the groups of ECC (parity) symbols 520 are carried in the same transmission stream 550 with their corresponding packets of data symbols 520 (that is, data and ECC symbols 520, where the two types of symbols are distinguishable based on, for example, location in the symbol stream, or metadata identifiers, etc.) For example, in some embodiments, the first ECC 530 is embedded in stream metadata packets (e.g., groups of parity symbols) corresponding to packets of data bytes and sent through the transmission encoding function (e.g., data encoder 515) to preserve consistent symbol encoding throughout the whole transmission stream 550.

With this technique, additional symbols are transmitted representing the FEC bytes (e.g., parity bytes 510 or parity symbols 520), while the original data symbols 520 are transmitted without further processing. This enables symbol-based error correction on the receiving side, where the received symbols may be processed with a low complexity FEC method, such as a Hamming code, to correct errors in the transmitted stream 550 after a source device encodes data bytes into symbols and before a sink device decodes the data symbols back into the data bytes. As another example, in some embodiments, the ECC is placed directly in the transmission stream and framed with control codes resulting in an ECC that is contiguous with the section of the transmission stream to be verified.

ECC generation in general generates far fewer parity bits or bytes than the corresponding amount of original data (i.e., each packet of data symbols 520 is generally far larger than its corresponding group of ECC symbols 520). Accordingly, the above technique greatly reduces the likelihood of errors in the transmission stream 550 that affect the receiving device from being able to recreate the original data. However, even though there may be far fewer ECC symbols than original data symbols, errors in the ECC symbols may create similar problems to those encountered when doing the FEC processing prior to encoding the data. For example, a single bit error in an ECC symbol may result in an invalid code, or a valid code that decodes to a completely different byte, thus introducing a byte error (e.g., up to eight separate bit errors) into the ECC at the receiving device end. For a low complexity FEC method, such as a Hamming code, such an error in an ECC symbol may make it impossible to correct transmission errors in the corresponding data symbols.

To address these concerns, several approaches may be used. For example, in step 120, which may be omitted in some embodiments, the ECC symbols 520 themselves may undergo processing through the first ECC generator 525 (e.g., treating the lower level ECC symbols 520 as data). That is, in some embodiments, the groups of ECC symbols 520 may go through first ECC generation and their resulting (higher level ECC) symbols added to the transmission stream 550. This allows transmission errors in the ECC symbols 520 to be easily corrected while reducing the exposure of byte-level corruption to only the higher level ECC symbols, which is normally significantly smaller than the data symbols and the (lowest level) ECC symbols.

In other embodiments, this process may be continued for many levels (e.g., higher level ECC symbols 520 processed through the first ECC generator 525 and data/ECC encoder 515 to generate still higher level ECC symbols), as would be apparent to one of ordinary skill, thus reducing the exposure of byte level corruption to the highest level ECC symbols, which is normally significantly smaller than the data symbols and lower level ECC symbols. For ease of description, the use of multi-level ECC symbols in the described embodiments may be omitted.

In still other embodiments, in step 120, the first ECC 530, in addition to or instead of being processed through one or more additional levels of first ECC generation as described above (e.g., Hamming code) may be processed through a second (e.g., higher complexity) ECC generator 535 (e.g., a byte-level ECC generator, such as Reed-Solomon or LDPC) to add additional ECC bytes (e.g., second ECC) to the data and ECC stream 510 prior to encoding. In step 130, the ECC symbols 520 may then be encoded from the first ECC and second ECC. Since the second ECC generator 535 only processes the first ECC 530, which is normally much smaller than the corresponding data symbols, the (potentially higher complexity) second ECC generator 535 processing may only be used for a relatively small amount of the overall data and parity bytes and symbols. However, the higher complexity techniques, such as Reed-Solomon and LDPC, allow multiple byte-level corruptions in the ECC symbols to be recovered from in case of errors to the ECC symbols during the transmission process. In even other embodiments, the above techniques may be extended to higher levels or combined (e.g., Reed-Solomon applied to the higher level first ECC bytes).

In step 140, the transmission stream 550 is transmitted to and received by the receiving device. For example, the transmission stream 550 may be sent one bit at a time at a set or predetermined transmission rate (e.g., a high-speed serial link) to the receiving device after having gone through the serializer 545. For instance, the packets of data symbols 520 may be sent first followed by their corresponding groups of ECC symbols 520. The transmission stream 550 is then received by the receiving device and, for example, de-serialized (using a de-serializer 555) into the (unextracted) data symbols and ECC symbols 560 that make up the transmission stream 550 sent to the receiving device. Control symbols may be used, for example, to separate the packets of data symbols 520 from the groups of ECC symbols 520.

In step 150, the ECC symbols 570 are extracted by a data/ECC extractor 565 from the received transmission stream 550 (e.g., the transmission stream 550 may be separated into ECC symbols 570 and data symbols 572). For example, depending on how the transmission stream 550 is assembled by the data/ECC encoder 515 prior to serializing through the serializer 545 (e.g., the locations of the metadata or parity symbols, or the control symbols used to identify or frame the metadata or parity symbols), the extraction of the ECC symbols 570 reverses this process to separate the ECC symbols 570 from the data symbols 572 representing the data stream. Likewise, the ECC symbols 570 are decoded by a data/ECC decoder 575 (using a corresponding decoding algorithm, such as a standard 10/8 decoding algorithm, to the encoding algorithm) to produce the corresponding ECC (parity) bytes 580 (such as the first BCC and second ECC as described above), which is illustrated schematically in FIG. 3 as a right-to-left movement through the data/ECC decoder 575).

In addition, in step 150, depending on the second ECC technique, if any, used (e.g., by the second ECC generator 535) to protect the first ECC bytes 530 or ECC symbols 520 in the source device, the corresponding error correction may be performed on the ECC 580 by the second error corrector 585 to produce the corrected first ECC 586. For example, if Reed-Solomon is used to protect the first ECC bytes 530, then the second error corrector 585 may be used to correct any errors in the decoded (first and second) ECC bytes 580 using Reed-Solomon error correcting logic (e.g., the decoded second ECC may be used to correct errors in the decoded first ECC).

If, or in addition to a more sophisticated technique such as Reed-Solomon or LDPC, a multiple level (e.g., two level) Hamming code ECC approach is used, then the higher level ECC symbols may be extracted by the data/ECC extractor 565, separating them from the data and lower level ECC symbols 572 (treating the lower level ECC symbols like data symbols for their first pass through the error correction process). The higher level ECC symbols 570 may be decoded by the data/ECC decoder 575 into higher level ECC 580, which (if, for example, Reed-Solomon is also used) may be processed through the second error corrector to create corrected (higher level) first ECC 586. The corrected (higher level) first ECC 586 may be used to correct the lower level ECC symbols 572 via a first error corrector 587 (such as a Hamming data corrector) to produce corrected lower level ECC symbols 588. These corrected lower level ECC symbols 588 may be input to the decoder 575 to create decoded lower level ECC 580 (illustrated schematically in FIG. 3. as entering from the bottom of the data/ECC decoder 575 and exiting to the left of the data/ECC decoder 575), which may be used, for example, as the corrected first ECC 586 (e.g., bypassing any second error correction from second error corrector 585).

In step 160, bit errors are corrected in the received data symbols 572 of the received transmission stream using the extracted, decoded, and corrected first ECC 586 in the first error corrector 587 to recover the corrected data symbols 588 that make up the data stream. For example, depending on the ECC algorithm used to in the first ECC generator 525 to generate the first ECC 530 (e.g., a Hamming code), the corresponding first ECC 586 extracted, decoded, and possibly corrected in step 150 is used to correct bit errors detected in the received data symbols 572 and create the corrected data symbols 588. This may be the same processing (and using the same first error corrector 587) that may be used in step 150 to correct the lower level ECC symbols using the extracted (and possibly corrected) higher level first ECC 586. For ease of understanding, in FIG. 3, the first error corrector 587 (and processing) may correspond to the first ECC generator 525 (e.g., perform the inverse processing) while the second error corrector 585 may correspond to the second ECC generator 535. In some embodiments, the second error corrector 585 and first error corrector 587 may be implemented as a single error corrector component.

In step 170, the extracted and corrected data symbols 588 are decoded (for example, using the same data/ECC decoder 575 used to decode the ECC symbols 570 earlier, only this time is illustrated schematically in FIG. 3 as an upward movement through the data/ECC decoder 575) to recover the data stream 590, which may then be supplied to the data sink 595 (e.g., a sink device such as a display device). For example, if the standard 8/10 encoder is used as the data/ECC encoder 515 in step 110 to encode the data stream 510 into data symbols 520, then the standard 10/8 decoder may be used to decode the recovered (corrected) data symbols 588 in the received transmission stream.

As mentioned above, in some embodiments, the ECC is carried in the transmission stream as symbols similar to the data symbols, with the ECC being embedded in stream metadata packets and sent through the transmission encoding function (e.g., the same transmission encoding function used to generate the data symbols) to preserve consistent encoding and decoding throughout the whole transmission stream. This is discussed further with reference to FIG. 4.

Figure 4:
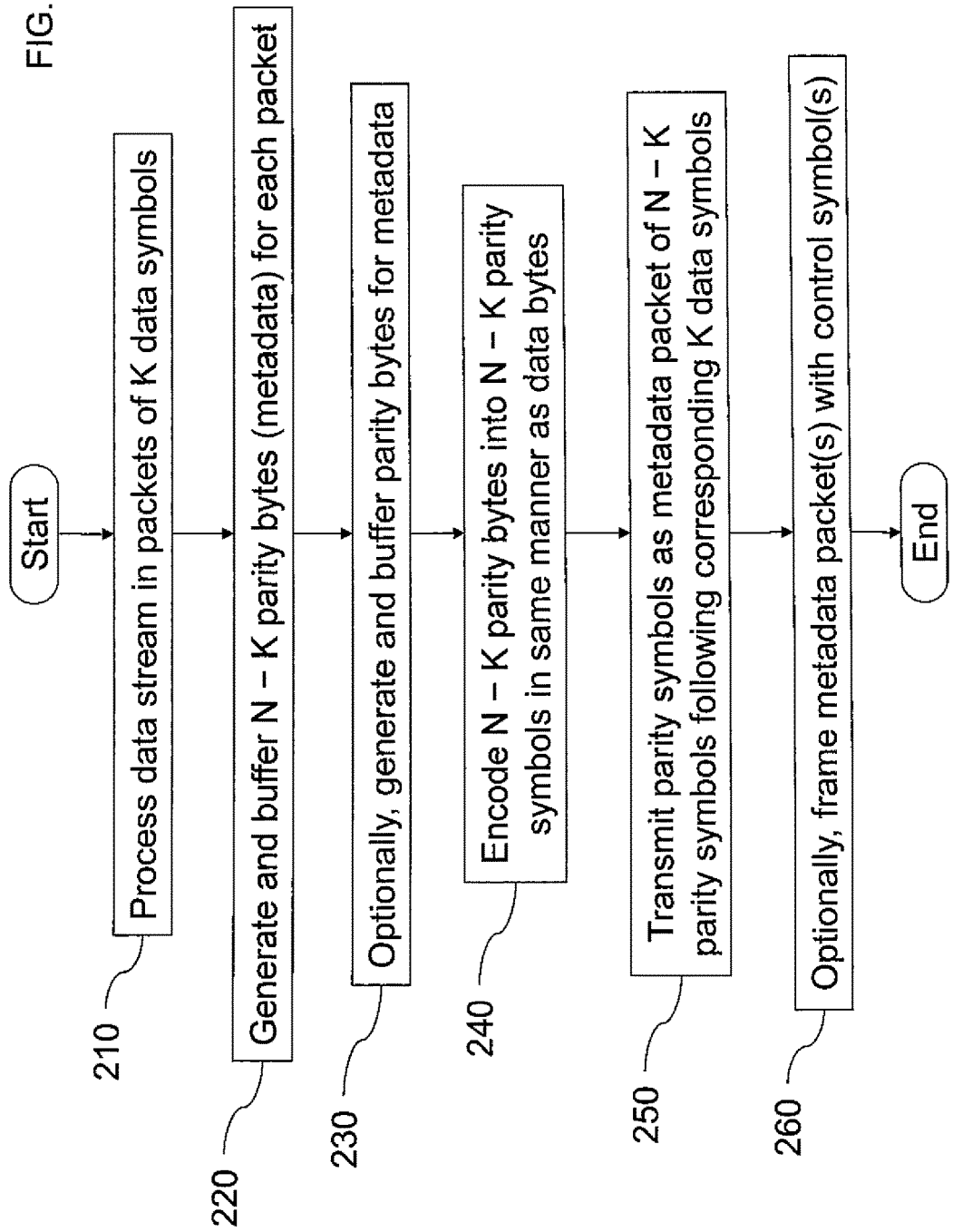
FIG. 4 is a flow chart of a method of creating and inserting FEC codes in a symbol encoded transmission stream according to an embodiment of the present invention.

FIG. 4 is a flow chart of a method of creating and inserting FEC codes in a symbol encoded transmission stream according to an embodiment of the present invention. By way of example, the method of FIG. 4 may be used to implement step 120 and step 130 in the method of FIG. 2 described above.

Processing begins, and in step 210, a FEC algorithm, such as a Hamming code, is used to generate ECC bits (parity bits) for a set or predetermined number of data symbols, such as in packets of K data symbols. For example, a (72,64) Hamming code, where every eight bytes (64 bits) of data has associated with it eight ECC bits or parity bits (i.e., a byte of parity bits), may be used to generate a parity byte for every eight data bytes. Thus, for every packet of 64 data symbols (representing 64×10=640 bits of symbols, or 640/8=80 bytes of symbols, which is 10 sets of 8 bytes apiece), a group of 10×8=80 ECC bits (i.e., 10 bytes) of parity (metadata) is generated using the (72,64) Hamming code. This group of 10 parity bytes may then be run through the same encoder as the data bytes to generate 10 corresponding symbols (parity symbols) of ECC, or many such groups of ECC bytes may be buffered prior to entering the encoder. The (72,64) Hamming code has enough parity bits to correct any single error in each packet of data symbols in the transmission stream and to detect any combination of two errors. Further, the (72,64) Hamming code is straightforward to implement to one of ordinary skill with simple logic and fast execution.

The ECC generation may take place concurrently with the symbol encoding of the data bytes, such as for every packet of K data symbols. Accordingly, in step 220, a group of N–K parity (ECC) bytes is generated for each packet of K data symbols, resulting in N total ECC bytes and data symbols. For example, with the (72,64) Hamming code as described above, K may be 64 data symbols in a packet while N–K may be 10 parity bytes corresponding to the 640 bits in the data symbols, for a total of N=74 parity bytes and data symbols associated with each packet of data symbols. The N–K parity bytes may be generated concurrently with the encoding of the K data symbols from the corresponding K data bytes. The N–K parity bytes may be buffered while another packet of K data symbols is encoded from the next K data bytes in the data stream.

In some embodiments, in step 230, the newly generated metadata (parity bytes) may itself be subjected to ECC generation. Otherwise, transmission errors in the metadata may cause significant disruption to the receiving ECC processing. Since a one bit error in an encoded ECC symbol may lead to numerous errors in the affected ECC byte after decoding, a stronger approach, such as a (12,10) Reed-Solomon code, may be employed here. Use of a Reed-Solomon code or similar error correction provides for complete correction of any affected ECC byte, regardless of how many bit errors are introduced in the affected byte, by adding two bytes of parity data.

In addition, Reed-Solomon with two parity bytes can correct any two ECC bytes in the group if the particular corrupted ECC bytes are already known (e.g., invalid ECC symbols in the received transmission stream result in corrupted values for their corresponding bytes, so these particular ECC bytes would be known to be bad, and any two of them in the group could be corrected using the two extra ECC bytes added with Reed-Solomon). This produces a total of N–K=12 such bytes or N=76 total parity bytes and data symbols associated with each packet of data. This group of 12 ECC bytes would then form the metadata for the packet of 64 data bytes. Several such packets of data bytes may be encoded and added to the transmission stream while their corresponding groups of ECC bytes are buffered and then encoded and added to the transmission stream after the data symbols.

In another embodiment, rather than using Reed-Solomon to protect the ECC bytes, the 10 (first level) ECC symbols (that is, the 10 parity bytes after they have undergone encoding to become 10 ECC symbols) are themselves subjected to the (72,64) Hamming code to generate an additional 2 (second level) ECC bytes, this time to protect the 10 first level ECC bytes from errors introduced after the ECC bytes have become symbols and transmitted to the sink device. This technique, too, generates a total of N–K=12 ECC bytes for each group, only employing the same (72,64) Hamming code throughout rather than a combination of the Hamming code and Reed-Solomon. In other embodiments, larger numbers of bytes (e.g., larger packets of data) may have ECC generated for them, for more efficient use of multi-level Hamming code, Reed-Solomon (or other more complex error correction logic such as LDPC), or combinations of these approaches.

In step 240, the N–K parity bytes are encoded into N–K parity symbols using, for example, the same encoding scheme used in the data byte encoding (e.g., the standard 8/10 encoder). Thus, for packets of 64 data symbols, groups of 10 or 12 corresponding parity symbols are encoded, resulting in a total of 74 or 76 parity and data symbols for each packet of data bytes. The 10 or 12 parity symbols may be thought of as a metadata packet corresponding to the data packet of 64 data symbols, with several such packets of data symbols being transmitted followed by their corresponding metadata packets of parity symbols.

In step 250, the packet is assembled for transmission as the K (e.g., 64) data symbols (data packet) followed by the N–K (e.g., 10 or 12) parity symbols (metadata packet), for a total of 74 or 76 symbols in the packet, each encoded with the same (e.g., DC balancing) encoding algorithm. As discussed above, several such data packets may be sent first and then followed by their corresponding metadata packets. In some embodiments, in step 260, the metadata packets may be separately framed or otherwise identified with control symbols (e.g., encoded symbol values with no corresponding decoded values), as are part of most encoding schemes. For example, a control symbol may be used to separate the data packet from the corresponding metadata packet (and another control signal, such as a differently valued control signal, used to separate the metadata packet from the next data packet).

Figure 5:
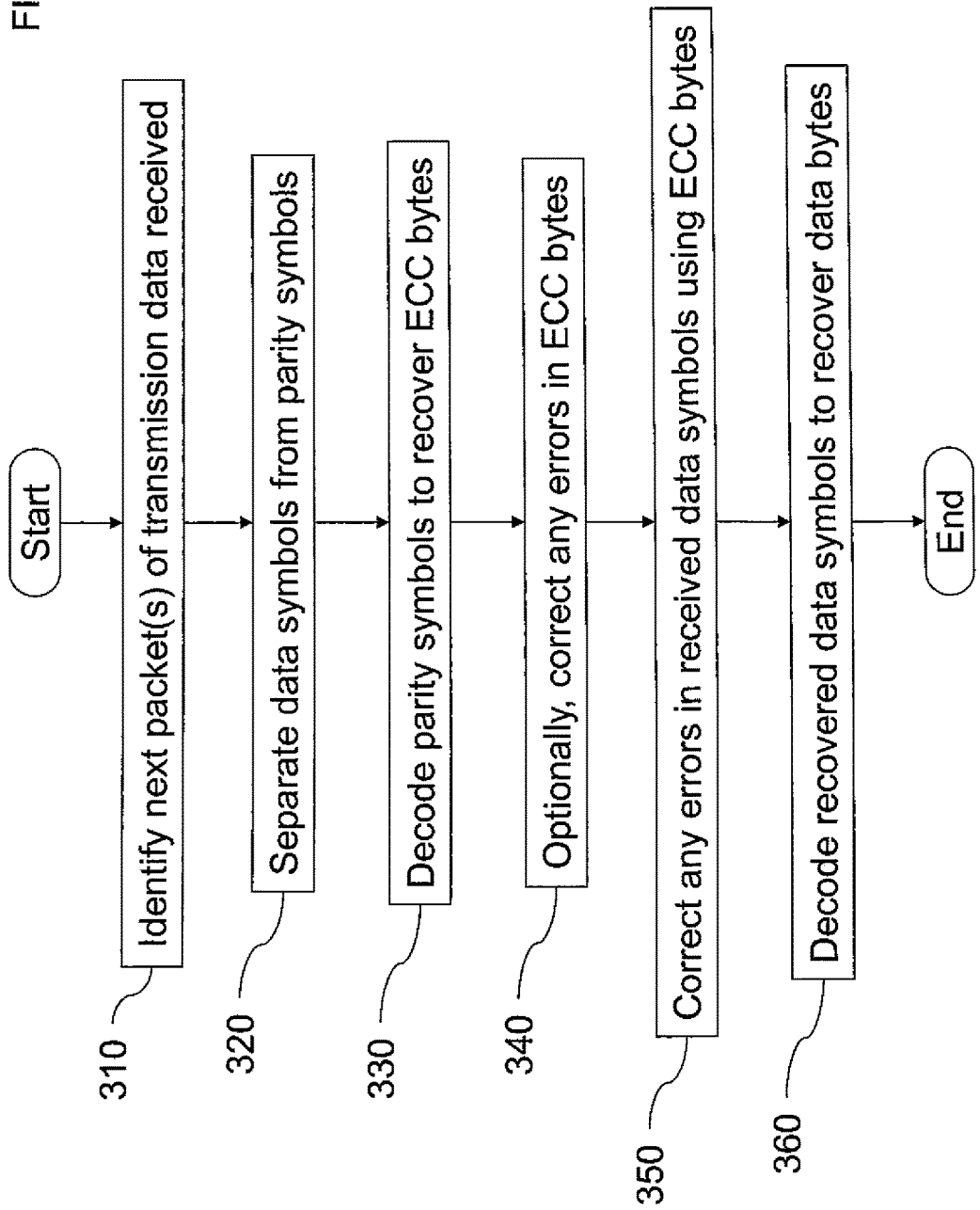
FIG. 5 is a flow chart of a method of removing and processing FEC codes in a symbol encoded transmission stream according to an embodiment of the present invention.

FIG. 5 is a flow chart of a method of removing and processing FEC codes in a symbol encoded transmission stream according to an embodiment of the present invention. By way of example, the method of FIG. 5 may be used to implement step 150, step 160, and step 170 in the method of FIG. 2 described above.

Processing begins, and in step 310, the next packets of transmission data received are identified. For example, in some embodiments, this may be implemented by keeping count of the received symbols, knowing the (data and ECC) packets start at regular intervals. In other embodiments, the beginning or end of a packet or set of packets may be identified (for example, with a control symbol).

In step 320, the packets are processed, moving the K data symbols corresponding to each packet to a buffer while separating the corresponding N–K parity symbols (in each metadata packet). As part of this process, control symbols are identified and handled accordingly (e.g., removed or otherwise separated). In case of multi-level ECC, the highest-level ECC symbols may be extracted from the data and lower level ECC symbols. In step 330, the parity symbols are decoded to recover the ECC bytes (or the highest-level ECC bytes, in case of multi-level ECC).

In step 340, if the parity bytes themselves were subjected to FEC processing (such as Reed-Solomon) or are part of a multi-level Hamming code (or both), then the recovered ECC bytes are checked, and any errors corrected (that are capable of correction), or the lower level ECC symbols are corrected by the higher level ECC symbols (or both). For example, with (12,10) Reed-Solomon, two extra parity bytes protect the ECC bytes, allowing one (or possibly two, if the particular parity bytes can be identified) of the twelve parity bytes to become corrupted (e.g., during symbol transmission) with full recovery of the ECC bytes (which, depending on factors such as how many ECC bytes are used and how many errors to the data symbols are introduced during transmission, may lead to full recovery of the data as well). Likewise, in other embodiments, if there are 10 first level (Hamming code) parity bytes, and 2 second level parity bytes, the second level parity bytes can be used to correct transmission errors in the first level parity symbols, which may then be decoded into first level ECC bytes and used to correct any errors in the data symbols.

In step 350, the ECC bytes are used to correct any transmission errors in the received data symbols. For example, with a (72,64) Hamming code, each group of 8 bytes of data symbols (64 bits) is protected by a corresponding byte (8 bits) of parity data, allowing single bit errors (in each group) to be corrected and double bit errors (in each group) to be detected. In some embodiments, this may be the same correction used with the multi-level ECC approach described above, only this time the correction being applied to the received data signals instead of to the lower level ECC symbols. In step 360, the recovered data symbols are decoded (e.g., using a 10/8 decoder) to recover the data bytes from the transmission stream. For example, this may use the same decoding logic as that used to decode the ECC symbols earlier.

Figure 6:
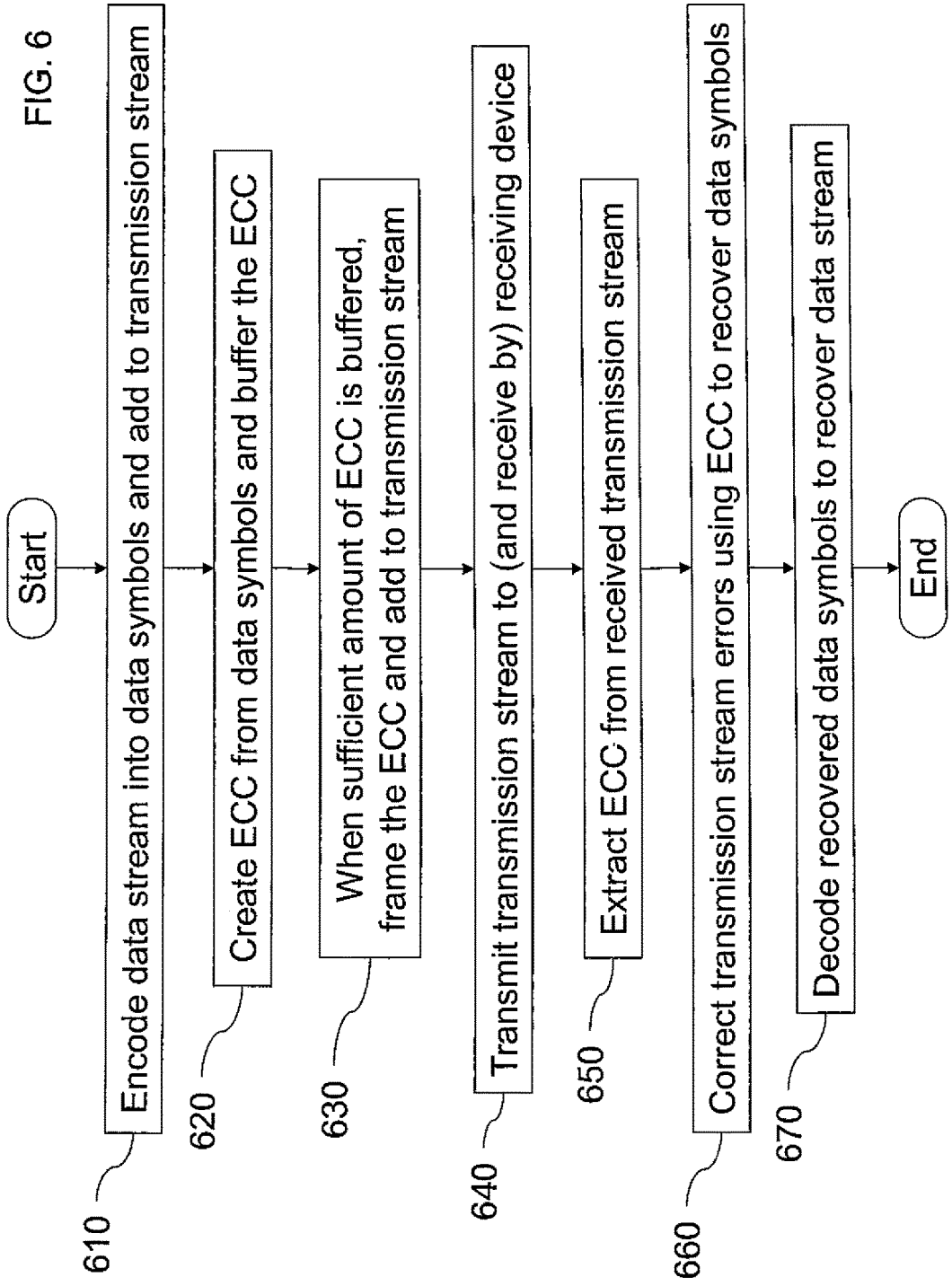
FIG. 6 is a flow chart of a method of transporting FEC codes in a symbol encoded transmission stream according to another embodiment of the present invention.

FIG. 6 is a flow chart of a method of transporting FEC codes in a symbol encoded transmission stream according to another embodiment of the present invention. FIG. 7 is a block diagram of a transmission stream encoder and decoder according to another embodiment of the present invention, such as the embodiment of FIG. 6. Portions of the embodiment(s) of FIG. 6 and FIG. 7 may be identical or similar to corresponding portions of the embodiment(s) of FIG. 2 and FIG. 3 described above. As such, descriptions of such portions may not be repeated.

Referring to FIG. 6 and FIG. 7, processing begins, and in step 610, a data stream 710 supplied by a data source 705 is encoded into symbols (or data symbols) 720 by a data encoder 715 and added to a transmission stream 750 (for example, a serial transmission stream 750 by a serializer 745). For example, packets of data bytes from the data stream 710 may be encoded into corresponding packets of data symbols 720 using an 8/10 encoder as the data encoder 715.

In step 620, the data symbols 720, in addition to being fed into the (serial) transmission stream 750 (via the serializer 745), are used to create an error correcting code (ECC) 730 (e.g., parity bits or bytes) for the data symbols 720 by an ECC generator 725. For example, a Hamming code may be used to generate the ECC 730 for the data symbols 720. Each packet of data symbols 720 may be used to generate a corresponding group of ECC 730. The Hamming code may have sufficient parity bits, for example, to detect multiple bit errors or to correct a single bit error in a set of symbols and ECC in the transmission stream 750, or to detect multiple bit errors and to correct a single bit error in the set of symbols and ECC, or to correct multiple bit errors in the symbols and ECC.

In step 630, a run length detector 735 is used to assess the generated ECC 730. To avoid, for example, some of the intricacies of encoding the ECC bytes (as described above with reference to FIG. 2 and FIG. 3), in the embodiment of FIG. 6 and FIG. 7, the ECC 730 is added to the transmission stream 750 without undergoing encoding. This helps prevent, for example, single bit errors in the transmission stream from producing multiple bit errors in the received ECC bytes. However, without encoding, the ECC 730 may not be in the proper form to satisfy transport protocols of the transmission stream 750 (for example, the ECC 730 may fail rules or guidelines related to DC balancing, or having a sufficient number of transitions between 0- and 1-bits or vice versa).

Accordingly, the run length detector 735 may gauge the generated ECC 730, and if the ECC 730 has reached some set or predetermined criteria (e.g., reached a certain length, or not in sufficient DC balance or with enough transitions to warrant further growth), the run length detector 735 may stop further buffering the ECC 730, and instead may insert the generated ECC 730 into the transmission stream 750 via the serializer 745. For example, the run length detector 735 may frame the ECC 730 with control symbols to produce framed ECC 740 and then insert the framed ECC 740 into the transmission stream 750 after its corresponding data packets.

In step 640, the transmission stream 750 is transmitted to and received by the receiving device. For example, the transmission stream 750 may be sent one bit at a time at a set or predetermined transmission rate (e.g., a high-speed serial link) to the receiving device after having gone through the serializer 745. For instance, packets of data symbols 720 may be sent first followed by a framed set of their corresponding groups of ECC bytes 740. The transmission stream 750 is then received by the receiving device and, for example, de-serialized (using a de-serializer 755) into the (unextracted) data symbols and ECC bytes 760 that make up the transmission stream 750 sent to the receiving device. Control symbols may be used, for example, to separate the packets of data symbols 720 from the groups of ECC bytes 730 (e.g., by framing the ECC bytes 730 into the framed ECC 740).

In step 650, the ECC bytes 770 are extracted from the received transmission stream 750 (e.g., the transmission stream 750 may be separated into the ECC bytes 770 and the data symbols 772). For example, depending on how the ECC 730 is framed by the run length detector 735 and inserted as the framed ECC 740 into the transmission stream 750 by the serializer 745 (e.g., the control symbols used to identify or frame the ECC bytes), the extraction of the ECC bytes 770 reverses this process to separate the ECC bytes 770 from the data symbols 772 representing the data stream.

In step 160, bit errors are corrected in the received data symbols 772 of the transmission stream using the extracted ECC bytes 770 to recover the corrected data symbols 780 that make up the data stream. For example, depending on the FEC algorithm used to generate the ECC bytes 730 (e.g., a Hamming code), the corresponding ECC bytes 770 extracted in step 650 are used to correct bit errors detected in the received data symbols 772 and create the corrected data symbols 780. The same processing may also be used to concurrently correct bit errors in the transmitted ECC bytes. For example, a Hamming code can detect and correct (transmission) errors in the data symbols 772 and their corresponding (unencoded) ECC bytes 770 as part of the same ECC processing.

In step 670, the recovered (corrected) data symbols 780 are decoded, for example, using a decoder 785 that reverses the encoding performed by the encoder 715, to recover the data stream 790, which may then be supplied to the data sink 795 (e.g., a sink device such as a display device). For example, if the standard 8/10 encoder is used as the data/ECC encoder 715 in step 610 to encode the data stream 710 into data symbols 720, then the standard 10/8 decoder may be used to decode the recovered (corrected) data symbols 780 in the received transmission stream.

While the present invention has been described in connection with certain example embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method to transport forward error correction (FEC) codes in a transmission stream by using a transmission stream encoder, the method comprising:
    encoding a data stream from a data source into data symbols by using the transmission stream encoder, the data stream being divided into a plurality of segments, each one of the data symbols representing, and having a greater number of bits than, a corresponding one of the plurality of segments of the data stream;
    generating first FEC codes from the data symbols by using the transmission stream encoder;
    encoding the first FEC codes into first FEC symbols by using the transmission stream encoder;
    generating second FEC codes from only the first FEC symbols by using the transmission stream encoder;
    encoding the second FEC codes into second FEC symbols by using the transmission stream encoder, the second FEC symbols being for error correcting the first FEC symbols;
    merging the data symbols, the first FEC symbols, and the second FEC symbols into the transmission stream by using the transmission stream encoder; and
    transmitting the merged transmission stream to a sink device.

2. The method of claim 1, wherein the encoding of the data stream into the data symbols and the encoding of the second FEC codes into the first FEC symbols comprise the same encoding technique.

3. The method of claim 1, wherein the merging of the data symbols and the first FEC symbols comprises merging a control symbol between the data symbols and the first FEC symbols into the transmission stream using the transmission stream encoder.

4. The method of claim 1, wherein the merging of the data symbols and the first FEC symbols comprises merging the first FEC symbols after the data symbols into the transmission stream using the transmission stream encoder.

5. The method of claim 4, wherein the transmitting of the merged transmission stream comprises:
    serializing the merged transmission stream by using the transmission stream encoder; and
    transmitting the serialized transmission stream over a serial data link to the sink device by using the transmission stream encoder.

6. The method of claim 5, wherein the merging of the data symbols and the first FEC symbols further comprises merging a control symbol after the first FEC symbols into the transmission stream by using the transmission stream encoder.

7. The method of claim 1, wherein the sink device comprises a display device.

8. A method to transport forward error correction (FEC) codes in a transmission stream by using a transmission stream decoder, the method comprising:
    receiving the transmission stream from a source device by using the transmission stream decoder;
    separating the received transmission stream into data symbols, first FEC symbols, and second FEC codes by using the transmission stream decoder;
    decoding the first FEC symbols into first FEC codes by using the transmission stream decoder;
    correcting errors only in the second FEC codes with only the first FEC codes by using the transmission stream decoder;
    correcting errors in the data symbols with the second FEC codes by using the transmission stream decoder; and
    decoding the corrected data symbols into a data stream by using the transmission stream decoder, the data stream being divided into a plurality of segments, each one of the corrected data symbols representing, and having a greater number of bits than, a corresponding one of the plurality of segments of the data stream.

9. The method of claim 8, wherein the decoding of the first FEC symbols into the first FEC codes and the decoding of the corrected data symbols into the data stream comprise the same decoding technique.

10. The method of claim 8, wherein the separating of the received transmission stream comprises separating a control symbol between the data symbols and the first FEC symbols from the transmission stream by using the transmission stream decoder.

11. The method of claim 8, wherein the separating of the received transmission stream comprises separating the data symbols from the received transmission stream before separating the first FEC symbols by using the transmission stream decoder.

12. The method of claim 11, wherein the receiving of the transmission stream comprises:
    receiving the transmission stream from the source device over a serial data link by using the transmission stream decoder; and
    de-serializing the received transmission stream by using the transmission stream decoder computing circuit.

13. The method of claim 12, wherein the separating of the received transmission stream further comprises separating a control symbol after the first FEC symbols from the received transmission stream by using the transmission stream decoder.

14. A method to transport forward error correction (FEC) codes in a transmission stream by using a transmission stream encoder and a transmission stream decoder, the method comprising:
    encoding a data stream at a source device from a data source into data symbols by using the transmission stream encoder, the data stream being divided into a plurality of segments, each one of the data symbols representing, and having a greater number of bits than, a corresponding one of the plurality of segments of the data stream;
    generating first FEC codes at the source device from the data symbols by using the transmission stream encoder;
    encoding the first FEC codes into first FEC symbols by using the transmission stream encoder;
    generating second FEC codes only from the first FEC symbols by using the transmission stream encoder;
    encoding the second FEC codes at the source device into second FEC symbols by using the transmission stream encoder;
    merging the data symbols, the first FEC symbols, and the second FEC symbols at the source device into the transmission stream by using the transmission stream encoder;
    transmitting the merged transmission stream from the source device to a sink device by using the transmission stream encoder;

receiving the transmitted transmission stream at the sink device from the source device by using the transmission stream decoder;

separating the received transmission stream at the sink device into received said data symbols, received said first FEC symbols, and received said second FEC symbols by using the transmission stream decoder;

decoding the received second first FEC symbols at the sink device into decoded second FEC codes by using the transmission stream decoder;

decoding the received first FEC symbols at the sink device into decoded first FEC codes by using the transmission stream decoder;

correcting errors in first FEC codes with the decoded second FEC codes by using the transmission stream decoder;

correcting errors in the received data symbols at the sink device with the corrected first FEC codes by using the transmission stream decoder; and decoding the corrected data symbols at the sink device into a data stream by using the transmission stream decoder.

15. The method of claim 14, wherein
the encoding of the data stream into the data symbols and the encoding of the second FEC codes into the second FEC symbols comprise the same encoding technique, and
the decoding of the received first FEC symbols into the decoded first FEC codes and the decoding of the corrected data symbols into the data stream comprise the same decoding technique.

16. The method of claim 14, wherein
the merging of the data symbols, the first FEC symbols, and the second FEC symbols comprises merging a control symbol at the source device between the data symbols, the first FEC symbols, and the second FEC symbols into the transmission stream by using the transmission stream encoder, and
the separating of the received transmission stream comprises separating received said control symbol at the sink device between the received data symbols, the received first FEC symbols, and the received second FEC symbols from the transmission stream by using the transmission stream decoder.

17. The method of claim 14, wherein
the merging of the data symbols, the first FEC symbols, and the second FEC symbols comprises merging the first and second FEC symbols at the source device after the data symbols into the transmission stream by using the transmission stream encoder, and
the separating of the received transmission stream comprises separating the received data symbols at the sink device from the received transmission stream before separating the received first and second FEC symbols by using the transmission stream decoder.

18. The method of claim 17, wherein the transmitting of the merged transmission stream comprises:

serializing the merged transmission stream at the source device by using the transmission stream encoder;

transmitting the serialized transmission stream over a serial data link from the source device to the sink device by using the transmission stream encoder;

receiving the transmitted transmission stream at the sink device from the source device over the serial data link by using the transmission stream decoder; and de-serializing the received transmission stream at the sink device by using the transmission stream decoder.

19. The method of claim 18, wherein
the merging of the data symbols, the first FEC symbols, and the second FEC symbols further comprises merging a control symbol at the source device after the first FEC symbols into the transmission stream by using the transmission stream encoder, and
the separating of the received transmission stream further comprises separating received said control symbol at the sink device after the first and second FEC symbols from the received transmission stream by using the transmission stream decoder.

20. The method of claim 14, wherein the sink device comprises a display device.

21. A source device comprising a transmission stream encoder, the transmission stream encoder being configured to:
encode a data stream from a data source into data symbols, the data stream being divided into a plurality of segments, each one of the data symbols representing, and having a greater number of bits than, a corresponding one of the plurality of segments of the data stream;
generate first FEC codes from the data symbols;
encode the first FEC codes into first FEC symbols;
generate second FEC codes from only the first FEC symbols;
encode the second FEC codes into second FEC symbols, the second FEC symbols being for error correcting the first FEC symbols; and
merge the data symbols, the first FEC symbols, and the second FEC symbols into a transmission stream.

22. A sink device comprising a transmission stream decoder, the transmission stream decoder being configured to:
receive a transmitted transmission stream;
separate the received transmission stream into received data symbols, received first FEC symbols, and received second FEC symbols;
decode the received second FEC symbols into decoded second FEC codes;
decode the received first FEC symbols into decoded first FEC codes;
correct errors in first FEC codes by using the decoded second FEC codes;
correct errors in the received data symbols by using the corrected first FEC codes; and
decode the corrected data symbols into a data stream.

* * * * *